United States Patent
Yang et al.

(10) Patent No.: US 9,450,543 B2
(45) Date of Patent: Sep. 20, 2016

(54) BANDWIDTH-EXTENDED DOHERTY POWER AMPLIFIER

(71) Applicant: Alcatel Lucent, Boulogne Billancourt (FR)

(72) Inventors: Yang Yang, Shanghai (CN); Lintao Liu, Shanghai (CN); Xianguang Guo, Shanghai (CN); Kaijie Jin, Shanghai (CN); Zhengde Yang, Shanghai (CN); Qiu Zhong, Shanghai (CN)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/367,098

(22) PCT Filed: Dec. 12, 2012

(86) PCT No.: PCT/IB2012/002864
§ 371 (c)(1),
(2) Date: Jun. 19, 2014

(87) PCT Pub. No.: WO2013/098639
PCT Pub. Date: Jul. 4, 2013

(65) Prior Publication Data
US 2014/0347134 A1      Nov. 27, 2014

(30) Foreign Application Priority Data
Dec. 29, 2011     (CN) .......................... 2011 1 0458925

(51) Int. Cl.
*H03F 3/68* (2006.01)
*H03F 3/19* (2006.01)
(Continued)

(52) U.S. Cl.
CPC .............. *H03F 3/19* (2013.01); *H03F 1/0288* (2013.01); *H03F 1/48* (2013.01); *H03F 3/211* (2013.01); *H03F 1/07* (2013.01); *H03F 3/68* (2013.01); *H03F 2200/36* (2013.01); *H03F 2203/21106* (2013.01); *H03F 2203/21139* (2013.01)

(58) Field of Classification Search
CPC ...... H03F 3/602; H03F 1/0288; H03F 3/211; H03F 3/24; H03F 2200/451; H03F 3/604; H03F 3/72; H03F 3/607; H03F 3/60
USPC ..................................... 330/124 R, 286, 295
See application file for complete search history.

(56) References Cited

U.S. PATENT DOCUMENTS 7,193,472 B2 *   3/2007   Gotou ................... H03F 1/0288
                                                              330/124 R
7,342,444 B2 *   3/2008   Kim ...................... H03F 1/0288
                                                              330/124 R
(Continued)

FOREIGN PATENT DOCUMENTS

| CN | 101836357 | 9/2010 |
|---|---|---|
| JP | 2006-166141 | 6/2006 |
| WO | WO 2008/035396 | 3/2008 |

OTHER PUBLICATIONS

Frederick H. Raab, "Efficiency of Doherty RF Power-Amplifier Systems," IEEE Transactions on Broadcasting, vol. BC-10, No. 3, pp. 77-83, XP011148551, Sep. 1987.
(Continued)

*Primary Examiner* — Khanh V Nguyen
(74) *Attorney, Agent, or Firm* — Fay Sharpe, LLP

(57) ABSTRACT

The present invention provides a new structure of Doherty power amplifier. The present invention reduces use of ¼ wavelength lines and lowers the Q point of the Doherty power amplifier. The present method extends the DPA bandwidth with a simpler and more convenient design and facilitates the design of a narrowed size.

3 Claims, 6 Drawing Sheets

(51) Int. Cl.
  *H03F 1/02* (2006.01)
  *H03F 1/48* (2006.01)
  *H03F 3/21* (2006.01)
  *H03F 1/07* (2006.01)

(56) References Cited

U.S. PATENT DOCUMENTS

| | | | | |
|---|---|---|---|---|
| 7,427,895 | B1 * | 9/2008 | Okubo | H03F 3/602 |
| | | | | 330/124 R |
| 7,646,248 | B2 * | 1/2010 | Yang | H03F 1/0288 |
| | | | | 330/124 R |
| 7,786,797 | B2 * | 8/2010 | Okazaki | H03F 1/0288 |
| | | | | 330/124 R |
| 7,936,213 | B2 * | 5/2011 | Shin | H03F 1/0288 |
| | | | | 330/124 R |
| 8,098,092 | B2 | 1/2012 | Miyashita et al. | |
| 8,395,450 | B2 * | 3/2013 | Deguchi | H01L 23/66 |
| | | | | 330/124 R |
| 2004/0113698 | A1 | 6/2004 | Kim et al. | |
| 2006/0055458 | A1 | 3/2006 | Shiikuma et al. | |
| 2006/0114064 | A1 | 6/2006 | Shiikuma | |

OTHER PUBLICATIONS

Doherty W. H., "A New High Efficiency Power Amplifier for Modulated Waves," Proceedings of the Institute of Radio Engineers, vol. 24, No. 9, pp. 1136-1182, XP000989691, Sep. 1936.
Blednov I. et al., "High Power LDMOS Integrated Doherty Amplifier for W-CDMA," Radio Frequency Integrated Circuits (RFIC) Symposium, IEEE, pp. 429-432, XP010925361, Jun. 11, 2006.
Gajadharsing J. R. et al., "Analysis and Design of a 200W LDMOS based Doherty amplifier for 3G base stations," Microwave Symposium Digest, IEEE, vol. 2, pp. 529-532, XP010727602, Jun. 6, 2004.
Daekyu Yu et al., "Fully Integrated Doherty Power Amplifiers for 5 GHz Wireless-LANs," Radio Frequency Integrated Circuits (RFIC) Symposium, IEEE, pp. 153-156, XP010925199, Jun. 11, 2006.
International Search Report for PCT/IB2012/002864 dated Jun. 12, 2013.
Jang, Dong-Hee, et al., "Asymmetric Doherty Power Amplifier with Optimized Characteristics in Output Power Back-Off Range between 6 DB and 10 dB", Proceedings of the 40th European Microwave Conference, Sep. 28-30, 2010, Paris, France, pp. 870-873.

* cited by examiner

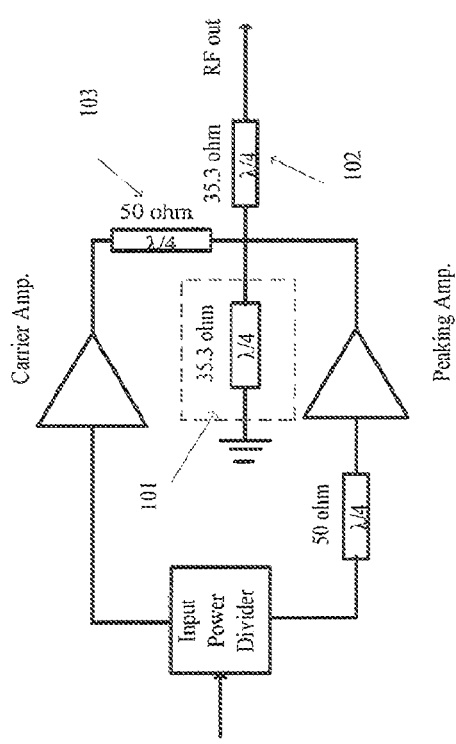
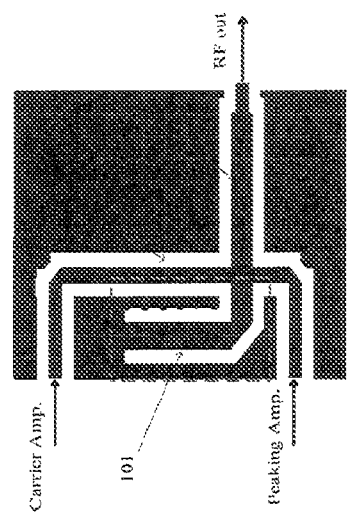

| | Eff@ drain efficiency under 38dBm output power | | output power at 3dB compression point | Neighboring channel drain-leakage ratio ACLR (after digital pre-distortion, LTE-1 channel) |
|---|---|---|---|---|
| Traditional DPA | 2500 MHZ | 22.3% | 48 | -56 |
| | 2600 MHz | 20% | 48.1 | -54 |
| | 2700 MHz | 16.5% | 47.9 | -54 |
| Present DPA | 2500 MHZ | 22.5% | 48 | -56 |
| | 2600 MHz | 22.5% | 48.1 | -55 |
| | 2700 MHz | 22% | 48 | -55 |

Fig.7

| | Eff@ drain efficiency under 38dBm output power | | Output power at 3dB compression point | 5M bandwidth neighboring channel drain-leakage ratio ACLR (after digital pre-distortion, WCDMA-1 channel) | 10M bandwidth neighboring channel drain-leakage ratio ACLR (after digital pre-distortion, WCDMA-1 channel) |
|---|---|---|---|---|---|
| Traditional DPA | 2110 MHZ | 47.1% | 56 | -54 | -56 |
| | 2140 MHz | 46.5% | 56 | -54 | -56 |
| | 2170 MHz | 46% | 55.9 | -52 | -56 |
| Present DPA | 2110 MHZ | 47.6% | 56 | -54 | -58 |
| | 2140 MHz | 47.6% | 55.9 | -54 | -58 |
| | 2170 MHz | 47.1% | 55.9 | -54 | -58 |

Fig.8

BANDWIDTH-EXTENDED DOHERTY POWER AMPLIFIER

FIELD OF THE INVENTION

The present invention relates to a power amplifier, and more specifically, to a bandwidth-extended Doherty power amplifier.

BACKGROUND OF THE INVENTION

The efficient Doherty power amplifier DPA has become increasingly popular in communication systems. However, the DPA has defective properties such as very narrow bandwidth and large size. The DPA narrow-band property is mainly due to the narrow-band property of a narrow-band mixer. An output mixer generally has a higher Q point, while the higher Q point causes a narrower bandwidth. With a balance-type DPA as an example, the Q point may amount to 0.76. However, the large-size property is due to the fact that the DPA output mixer uses two ¼ wavelength lines (λ/4). Particularly for a 900 MHz system, when using Rogers's high-frequency printed circuit board material RO4350B as the PCB material, the length of the ¼ wavelength line is about 47 mm; therefore, the size design cannot be scaled down.

Currently, a scheme for extending bandwidth for a DPA has been proposed, as shown in FIG. 1. In that scheme, a ¼ wavelength line 101 of 35.3 Ohm is grounded to form a minor with the ¼ wavelength line of the Doherty mixer on a layout. When the DPA works at a relatively lower input power, the peaking amplifier is closed, and the carrier amplifier will work in a high-resistance state (generally at 100 Ohm). For the DPA having the 35.3 Ohm ¼ wavelength line 101, resistance dispersion will become more converged than that of a common DPA with the carrier amplifier working at the high-impedance. Therefore, the bandwidth of a bandwidth-extended DPA will be much wider than that of a non-bandwidth extended DPA, as shown in FIG. 2.

However, at present, small-size design has become a fashion. Although the above scheme provides an idea to design a wideband DPA, the additional 35.3 Ohm ¼ wavelength line occupies more space. It becomes a problem for the PCB (printed circuit board) design of a power amplifier.

SUMMARY OF THE INVENTION

In order to solve the above drawbacks in the prior art, the present invention provides a new structure of a Doherty power amplifier so as to lower Q point and reduce use of ¼ wavelength lines. The present method extends the DPA bandwidth with a simpler and more convenient design and facilitates the design of a narrowed size.

Specifically, according to one embodiment of the present invention, there is provided a Doherty power amplifier, comprising an input power divider into which an input signal of the Doherty power amplifier is inputted, one output of the input power divider being connected to a carrier amplifier, the other output of the divider being connected to a first ¼ wavelength line, the other end of the first ¼ wavelength line being connected to a peaking amplifier, one end of the carrier amplifier being connected to a second ¼ wavelength line, the other end of the second ¼ wavelength line being connected to the peaking amplifier; a junction point between the second ¼ wavelength line and the peaking amplifier being a signal output point of the Doherty power amplifier.

According to one preferred embodiment of the present invention, the characteristic impedance $Z_{01}$ of the second ¼ wavelength line is determined by the following equation:

$$Z_{01} = 50 * \sqrt{(1+\gamma)},$$

where $\gamma$ is power ratio.

According to one preferred embodiment of the present invention, the load impedance $Z_{02}$ of the peaking amplifier is determined by the following equation:

$$Z_{02} = \frac{50*(1+\gamma)}{\gamma},$$

where $\gamma$ is power ratio.

According to one preferred embodiment of the present invention, when the input signal is low, the peaking amplifier is closed, and the carrier amplifier works in a high-impedance state, wherein impedance of the carrier amplifier is determined by the following equation:

$$Z_{high\_impedance} = 50*(1+\gamma),$$

where $\gamma$ is power ratio.

BRIEF DESCRIPTION OF THE SEVERAL VIEWS OF THE DRAWINGS

Other objectives and effects of the present invention will become much clearer and easier to understand through the following description taken in conjunction with the accompanying drawings and with more completely understanding of the present invention, wherein:

FIGS. 1a and 1b show a principle diagram and a layout diagram of an existing bandwidth-extended DPA, respectively.

FIG. 7 shows performance comparison between the traditional scheme and the present solution employed in a balance-type DPA using MD7IC2755NR1.

FIG. 8 shows performance comparison between the traditional scheme and the present solution employed in a non-balance type DPA using MRF8S21120HR3 and MRF8S21201HR3.

In all of the above accompanying drawings, like reference numbers indicate same, like or corresponding features or functions.

DETAILED DESCRIPTION OF THE INVENTION

The embodiments of the present invention are described in detail with reference to the accompanying drawings.

Figure 2A:
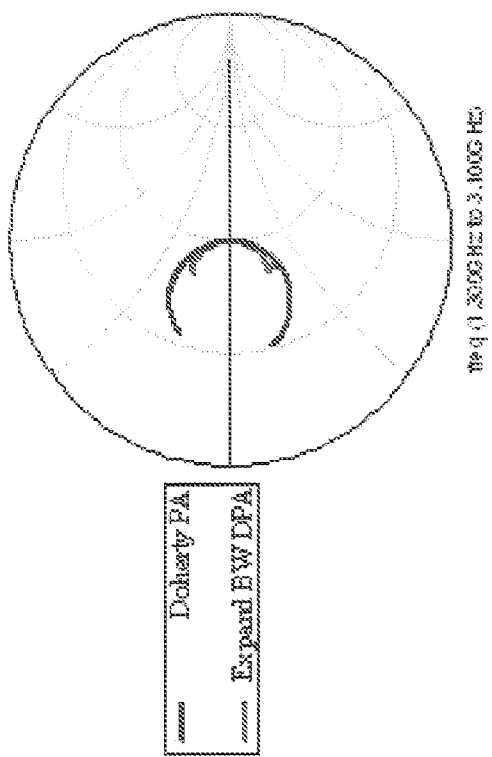
FIGS. 2a and 2b show an impedance dispersion property and bandwidth of an existing bandwidth-extended DPA, respectively.
Figure 2B:
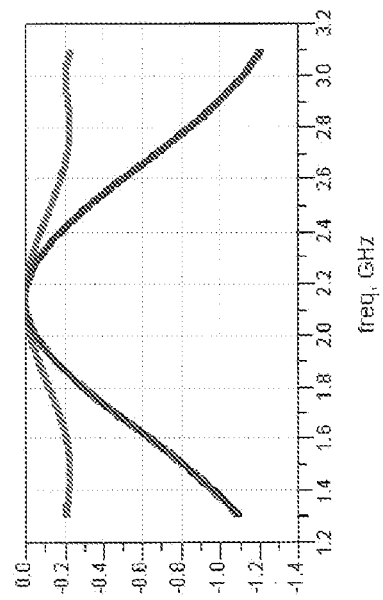
Figure 3A:
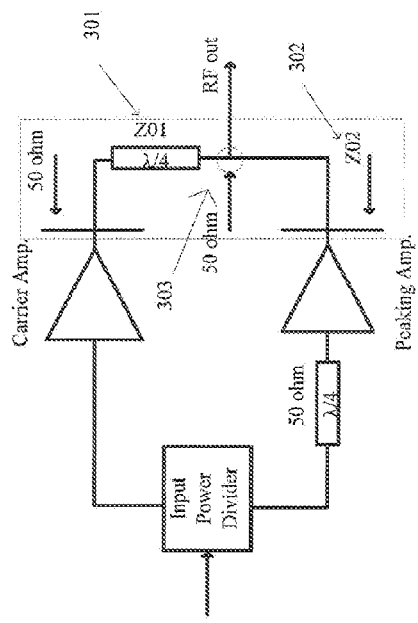
FIGS. 3a and 3b show a principle diagram and a layout diagram of a bandwidth-extended DPA according to an embodiment of the present invention, respectively.
Figure 3B:
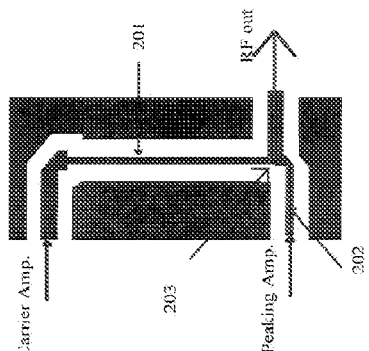

In the bandwidth-extended DPA design of the present invention, use of ¼ wavelength lines is reduced. As shown in FIG. 3, a bandwidth-extended Doherty power amplifier comprises an input power divider into which an input signal of the Doherty power amplifier is inputted, one output of the input power divider being connected to a carrier amplifier, the other output of the divider being connected to a first ¼ wavelength line, the other end of the first ¼ wavelength line being connected to a peaking amplifier, one end of the carrier amplifier being connected to a second ¼ wavelength line, the other end of the second ¼ wavelength line being connected to the peaking amplifier, a junction point between the second ¼ wavelength line and the peaking amplifier being a signal output point of the Doherty power amplifier.

In the present invention, the characteristic impedance $Z_{01}$ of the second ¼ wavelength line 201 and the load impedance $Z_{02}$ of the peaking amplifier 202 have to be determined.

The characteristic impedance $Z_{01}$ of the second ¼ wavelength line is determined by the following equation:

$$Z_{01}=50*\sqrt{(1+\gamma)} \quad (1)$$

where, $\gamma$ is the power ratio of DPA.

The load impedance $Z_{02}$ of the peaking amplifier 202 is determined by the following equation:

$$Z_{02} = \frac{50*(1+\gamma)}{\gamma} \quad (2)$$

where, $\gamma$ is the power ratio of DPA.

For a balance-type DPA with a power ratio 1:1, $\gamma=1$, $Z_{01}$ is 70.7 Ohm, the load impedance $Z_{02}$ of the peaking amplifier is matched to 100 Ohm. For a non-balance type DPA with a power ration 1:2, $\gamma=2$, $Z_{01}$ is 86.6 Ohm, the load impedance $Z_{02}$ of the peaking amplifier of the DPA is 75 Ohm.

When the input signal is low, the peaking amplifier is closed.

Figure 5:
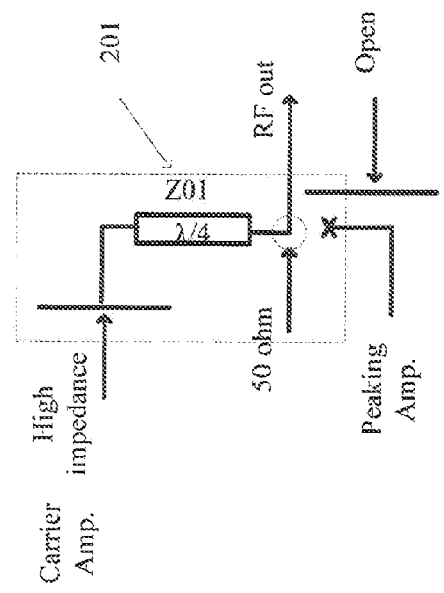
FIG. 5 shows an equivalent circuit diagram of a bandwidth-extended DPA according to an embodiment of the present invention when it works at a small signal input.

At this point, the carrier amplifier works at a high impedance state, as shown in FIG. 5a.

The impedance $Z_{high\_impedance}$ of the carrier amplifier is calculated as follows:

$$Z_{high\_impedance}=50*(1+\gamma) \quad (3),$$

where, $\gamma$ is the power ratio of DPA.

For a balance type DPA with a power ratio 1:1, the load impedance $Z_{high\_impedance}$ of the carrier amplifier is 100 Ohm, while for a non-balance type DPA with a power ratio 1:2, the load impedance $Z_{high\_impedance}$ of the carrier amplifier is 150 Ohm.

When the input signal is very large, the peaking amplifier will reach a saturation state, and the load impedance $Z_{02}$ of the peaking amplifier is shown in equation (2).

Figure 6:
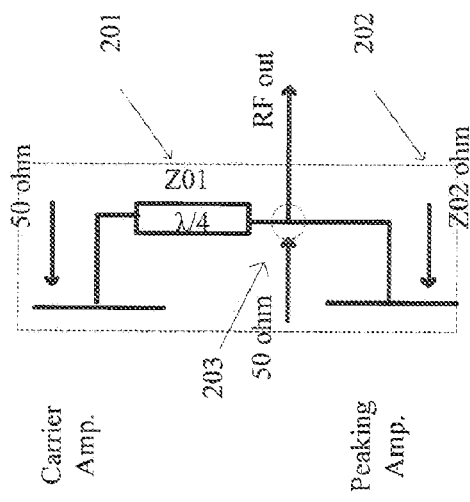
FIG. 6 shows an equivalent circuit diagram of a bandwidth-extended DPA according to an embodiment of the present invention when it works at a large signal input.

At this point, the load impedance of the carrier amplifier is 50 Ohm. The impedance through the second ¼ wavelength line 201 is converted into $50*(1+\gamma)$ Ohm, and is connected in parallel with the load impedance $Z_{02}$ of the peaking amplifier, i.e., 50 Ohm, as shown in FIG. 6.

When the input signal is switched from a small signal to a large signal, the load impedance of the carrier amplifier is reduced to 50 Ohm, and the load impedance of the peaking amplifier is reduced to $Z_{02}$.

This design of the present invention modifies the characteristic impedance of the peaking amplifier 202 and the characteristic impedance of the second ¼ wavelength line, such that the impedance of the DPA mixer is maintained at 50 Ohm. Because the impedance of the mixer rises to 50 Ohm, when the input signal is relatively small and the peaking amplifier does not work, the impedance of the second ¼ wavelength line 201 is converted from 50 Ohm, instead of 25 Ohm, to a high impedance (generally 100 Ohm). In this way, the Q point of the Doherty mixer can be successfully lowered. For example, for a balance-type DPA, by applying the present invention, the Q point can be lowered to 0.33, while the Q point of a common traditional balance type DPA is 0.76.

Figure 4A:
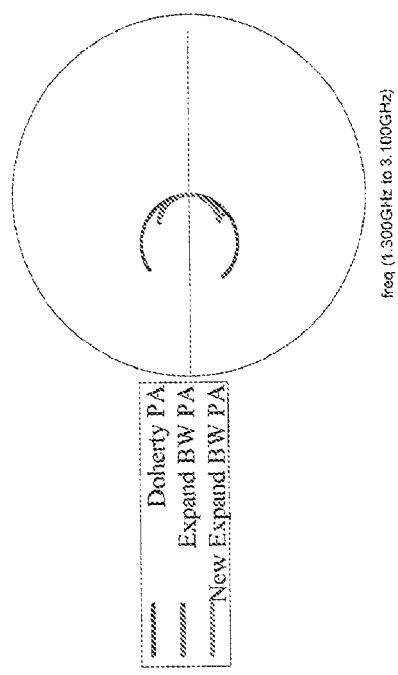
FIGS. 4a and 4b show an impedance dispersion property and bandwidth of a bandwidth-extended DPA according to an embodiment of the present invention, respectively.
Figure 4B:
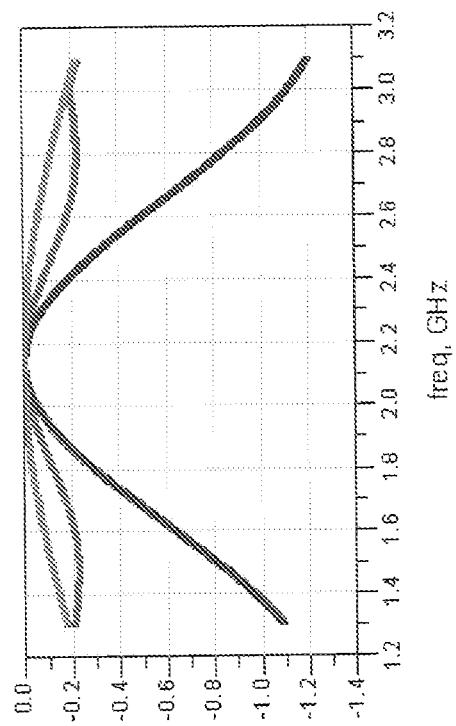

As shown in FIG. 4, the impedance dispersion property and bandwidth of the new bandwidth-extended DPA according to the present invention are both superior to that of a traditional DPA. Moreover, the circuit portion of the mixer merely adopts one ¼ wavelength line. Therefore, a smaller size is achieved, as shown in FIG. 4b. In other words, by applying the present invention, the output mixer of DPA merely uses one ¼ wavelength line, which lowers the Q value and may achieve the technical effect of extending bandwidth and scaling down the size.

Further, the present invention provides a comparison between technical effects of the traditional solution and the present solution.

As shown in FIG. 7, the performance comparison between applying the traditional solution and applying the present solution in a balance type DPA using a MD7IC2755NR1 power amplifier shows that by applying the present invention, the DAP drain efficiency can improve 6% over the traditional design, and the drain efficiency and peaking power are both smooth within a bandwidth of 200 MHz. As shown in FIG. 8, the performance comparison between applying the traditional solution and applying the present solution in a non-balance type DPA using MRF8S21120HR3 and MRF8S21201HR3 power amplifiers shows that the present bandwidth-extended DPA may obtain a smoother drain efficiency and peaking efficiency over the traditional design. The above MD7IC2755NR1, MRF8S21120HR3 and MRF8S21201HR3 are models of power amplifier devices.

The present invention may be applied to a power amplifier design for any system, including LTE, WCDMA, Wimax, etc.

It should be understood from the foregoing description that modifications and alterations may be made to the respective embodiments of the present invention without departing from the spirit of the present invention. The description in the present specification is intended to be illustrative and not limiting. The scope of the present invention is limited by the appended claims only.

What is claimed is:

1. A Doherty power amplifier, comprising an input power divider into which an input signal of the Doherty power amplifier is inputted, one output of the input power divider being connected to a carrier amplifier, the other output of the divider being connected to a first ¼ wavelength line, the other end of the first ¼ wavelength line being connected to a peaking amplifier, one end of the carrier amplifier being connected to a second ¼ wavelength line, the other end of the second ¼ wavelength line being connected to the peaking amplifier; a junction point between the second ¼ wavelength line and the peaking amplifier being a signal output point of the Doherty power amplifier, wherein a characteristic impedance $Z_{01}$ of the second ¼ wavelength line is determined by the following equation:

$$Z_{01}=50*\sqrt{(1+\gamma)},$$

where, $\gamma$ is a power ratio.

2. A Doherty power amplifier, comprising an input power divider into which an input signal of the Doherty power amplifier is inputted, one output of the input power divider being connected to a carrier amplifier, the other output of the divider being connected to a first ¼ wavelength line, the other end of the first ¼ wavelength line being connected to a peaking amplifier, one end of the carrier amplifier being connected to a second ¼ wavelength line, the other end of the second ¼ wavelength line being connected to the peaking amplifier; a junction point between the second ¼ wavelength line and the peaking amplifier being a signal output point of the Doherty power amplifier, wherein a load impedance $Z_{02}$ of the peaking amplifier is determined by the following equation:

$$Z_{02} = \frac{50*(1+\gamma)}{\gamma},$$

where, $\gamma$ is a power ratio.

3. A Doherty power amplifier, comprising an input power divider into which an input signal of the Doherty power amplifier is inputted, one output of the input power divider being connected to a carrier amplifier, the other output of the divider being connected to a first ¼ wavelength line, the other end of the first ¼ wavelength line being connected to a peaking amplifier, one end of the carrier amplifier being connected to a second ¼ wavelength line, the other end of the second ¼ wavelength line being connected to the peaking amplifier; a junction point between the second ¼ wavelength line and the peaking amplifier being a signal output point of the Doherty power amplifier, wherein when the input signal is small, the peaking amplifier is closed, and the carrier amplifier works in a high-impedance state, the impedance of the carrier amplifier being determined by the following equation:

$$Z_{high\_impedance} = 50*(1+\gamma),$$

where, $\gamma$ is a power ratio.

\* \* \* \* \*